(12) United States Patent
Kansas (10) Patent No.: US 12,095,285 B2
(45) Date of Patent: Sep. 17, 2024

(54) MIRROR AMPLIFIED CLEAN ENERGY SYSTEM

(71) Applicant: John Kansas, Lyman, SC (US)

(72) Inventor: John Kansas, Lyman, SC (US)

(*) Notice: Subject to any disclaimer, the term of this patent is extended or adjusted under 35 U.S.C. 154(b) by 158 days.

(21) Appl. No.: 17/699,417

(22) Filed: Mar. 21, 2022

(65) Prior Publication Data

US 2022/0385110 A1 Dec. 1, 2022

Related U.S. Application Data

(60) Provisional application No. 63/193,636, filed on May 27, 2021.

(51) Int. Cl.
| | |
|---|---|
| *H02S 40/22* | (2014.01) |
| *H02J 50/30* | (2016.01) |
| *H02N 11/00* | (2006.01) |
| *H02S 40/36* | (2014.01) |
| *H02S 40/38* | (2014.01) |

(52) U.S. Cl.
CPC ............ *H02J 50/30* (2016.02); *H02N 11/002* (2013.01); *H02S 40/22* (2014.12); *H02S 40/36* (2014.12); *H02S 40/38* (2014.12)

(58) Field of Classification Search
CPC ..... H02S 40/20; H02S 40/22; H01L 31/0547; H01L 31/0232; H01L 31/02325
See application file for complete search history.

(56) References Cited

U.S. PATENT DOCUMENTS 4,398,053 A * 8/1983 Orillion .............. H01L 31/0547
136/246

FOREIGN PATENT DOCUMENTS

WO WO-2021043587 A1 * 3/2021 ............ H02S 40/22

* cited by examiner

*Primary Examiner* — Christina Chern
(74) *Attorney, Agent, or Firm* — Kim and Lahey Law Firm, LLC; Robert Merting; Seann Lahey (57) ABSTRACT

A self-contained clean energy system includes mirrors that amplify and reflect light received from a battery-powered LED to an angled chamber lined with alternating solar cells and mirrors to power the system and to further power LED lights in similar systems in communication with the clean energy system, which is independent of a power grid.

11 Claims, 10 Drawing Sheets

MIRROR AMPLIFIED CLEAN ENERGY SYSTEM

CROSS REFERENCE TO RELATED APPLICATIONS

This application claims benefit of U.S. Provisional Patent Application Ser. No. 63/193,636, filed with the United States Patent and Trademark Office (USPTO) on May 27, 2021, which is incorporated in its entirety by reference thereto.

BACKGROUND OF THE DISCLOSURE

Conventional production and delivery of electricity to most homes, office buildings, manufacturing facilities, and the like are accomplished using extensive power grids with associated infrastructure such as generators, transformers, electrical lines, et cetera. Maintaining, upgrading, or adding electrical power infrastructure to accommodate a geographic area, particularly one with a growing population, involves substantial costs. Moreover, conventional generation of electricity usually requires burning fossil fuels, such as coal and fuel oil.

What is needed in the industry is a clean power source that is not reliant on a conventional power infrastructure and is simple to make and easy to install and utilize.

BRIEF SUMMARY OF THE DISCLOSURE

The present disclosure is directed in general to a self-contained, clean power system that is simple to make, install, and use, whether in a single-family home or a skyscraper. Moreover, the power source is not limited to home or office use—it can, for instance, replace batteries in electric cars, or it can be used to generate power for electrolysis to remove carbon dioxide ($CO_2$) from the atmosphere. Various embodiments and equivalents of the clean power system are described herein.

In one embodiment, a clean energy system may include a housing with a chamber formed therein; a light source, such as an LED, disposed proximate the housing, light rays from the light source being directed into the chamber; a plurality of mirrors disposed within the chamber, the light rays being incident to the mirrors; and a plurality of solar panels disposed within lines of sight of the mirrors, the incident light rays being reflected by the mirrors into the solar panels to generate electrical power. A magnification lens can be provided to amplify the light rays from the light source into the plurality of mirrors. Also in this embodiment, the housing may be a six-sided structure and may be shaped substantially conically, and the solar cells may be connected in series. Still further, at least some of the mirrors in this embodiment may be arranged in a pyramid shape within the chamber.

In another embodiment according to the disclosure, a method of producing, clean energy, may include providing a housing having a chamber formed therein; providing a light source disposed proximate the housing; illuminating the light source to produce light rays and directing the light rays into the chamber; placing a plurality of mirrors within the chamber such that the light rays are incident to the plurality of mirrors; placing a plurality of solar panels within lines of sight of the mirrors; reflecting the incident light rays from the mirrors into the solar panels; and generating electrical power from the solar panels. The method may further include directing the electrical power from the solar panels into at least one other chamber to generate additional electrical power in the other chamber.

In a further aspect of the method a second housing having a second chamber formed therein may be provided, and a second light source disposed proximate the second housing may be provided. The method may further include illuminating the second light source to produce a second set of light rays and directing the second set of light rays into the second chamber; placing a second plurality of mirrors within the second chamber such that the second set of light rays are incident to the second plurality of mirrors; placing a second plurality of solar panels within lines of sight of the second set of mirrors; reflecting the incident light rays from the second set of mirrors into the second plurality of solar panels; generating additional electrical power from the second plurality of solar panels; and combining the electrical power from the solar panels with the additional electrical power from the second plurality of solar panels.

Additional objects and advantages of the present subject matter are set forth in, or will be apparent to, those of ordinary skill in the art from the description herein. Also, it should be further appreciated that modifications and variations to the specifically illustrated, referenced, and discussed features, processes, and elements hereof may be practiced in various embodiments and uses of the disclosure without departing from the spirit and scope of the subject matter. Variations may include, but are not limited to, substitution of equivalent means, features, or steps for those illustrated, referenced, or discussed, and the functional, operational, or positional reversal of various parts, features, steps, or the like. Those of ordinary skill in the art will better appreciate the features and aspects of the various embodiments, and others, upon review of the remainder of the specification.

BRIEF DESCRIPTION OF THE DRAWINGS

A full and enabling disclosure of the present subject matter, including the best mode thereof directed to one of ordinary skill in the art, is set forth in the specification, which refers to the appended figures, wherein.

DETAILED DESCRIPTION OF THE DISCLOSURE

As required, detailed embodiments are disclosed herein; however, the disclosed embodiments are merely exemplary and may be embodied in various forms. Therefore, specific structural and functional details disclosed herein are not to be interpreted as limiting, but merely as a basis for the claims and as a representative basis for teaching one skilled in the art to variously employ the exemplary embodiments of the present disclosure, as well as their equivalents.

Unless defined otherwise, all technical and scientific terms used herein have the same meaning as is commonly understood by one of ordinary skill in the art to which this disclosure belongs. In the event that there is a plurality of definitions for a term or acronym herein, those in this section prevail unless stated otherwise.

Wherever the phrase "for example," "such as," "including," and the like are used herein, the phrase "and without limitation" is understood to follow unless explicitly stated otherwise. Similarly, "an example," "exemplary" and the like are understood to be non-limiting.

The term "substantially" allows for deviations from the descriptor that do not negatively impact the intended purpose. Descriptive terms are understood to be modified by the term "substantially" even if the word "substantially" is not explicitly recited.

The term "about" when used in connection with a numerical value refers to the actual given value, and to the approximation to such given value that would reasonably be inferred by one of ordinary skill in the art, including approximations due to the experimental and or measurement conditions for such given value.

The terms "comprising" and "including" and "having" and "involving" (and similarly "comprises," "includes," "has," and "involves") and the like are used interchangeably and have the same meaning. Specifically, each of the terms is defined consistent with the common United States patent law definition of "comprising" and is therefore interpreted to be an open term meaning "at least the following," and is also interpreted not to exclude additional features, limitations, aspects, etcetera. Thus, for example, "a device having components a, b, and c" means that the device includes at least components a, b, and c. Similarly, the phrase: "a method involving steps a, b, and c" means that the method includes at least steps a, b, and c.

Where a list of alternative component terms is used, e.g., "a structure such as 'a,' 'b,' 'c,' 'd' or the like," or "a" or b," such lists and alternative terms provide meaning and context unless indicated otherwise.

Unless the context clearly requires otherwise, throughout the description and the claims, the words "comprise," "comprising," and the like are to be construed in an inclusive sense as opposed to an exclusive or exhaustive sense; in the sense of "including, but not limited to."

A series circuit, which is a closed circuit in which electric current follows a single path, may be used herein with various embodiments as required or needed by an end user. In that exemplary arrangement, devices along the circuit may be connected in a continuous row similar to a string of Christmas lights or landscape luminaries.

A parallel circuit, which is a closed circuit wherein current divides into two or more paths before rejoining to complete the circuit, may be used herein with various embodiments as required or needed by an end user. Wiring in a parallel circuit is configured so that each device is in constant contact with the main circuit pathway, as used in most homes and buildings to provide power to separate light fixtures, outlets, and appliances. Accordingly, an individual circuit loop in the parallel circuit may fail and cause a single device to lose power without interrupting the entire circuit.

The various embodiments of the disclosure and/or equivalents falling within the scope of present disclosure overcome or ameliorate at least one of the disadvantages of the prior art or provide a useful alternative.

Detailed reference will now be made to the drawings in which examples embodying the present subject matter are shown. The detailed description uses numerical and letter designations to refer to features of the drawings. The drawings and detailed description provide a full and written description of the present subject matter, and of the manner and process of making and using various exemplary embodiments, so as to enable one skilled in the pertinent art to make and use them, as well as the best mode of carrying out the exemplary embodiments. The drawings are not necessarily to scale, and some features may be exaggerated to show details of particular components. Thus, the examples set forth in the drawings and detailed descriptions are provided by way of explanation only and are not meant as limitations of the disclosure. The present subject matter thus includes any modifications and variations of the following examples as come within the scope of the appended claims and their equivalents.

Figure 1:
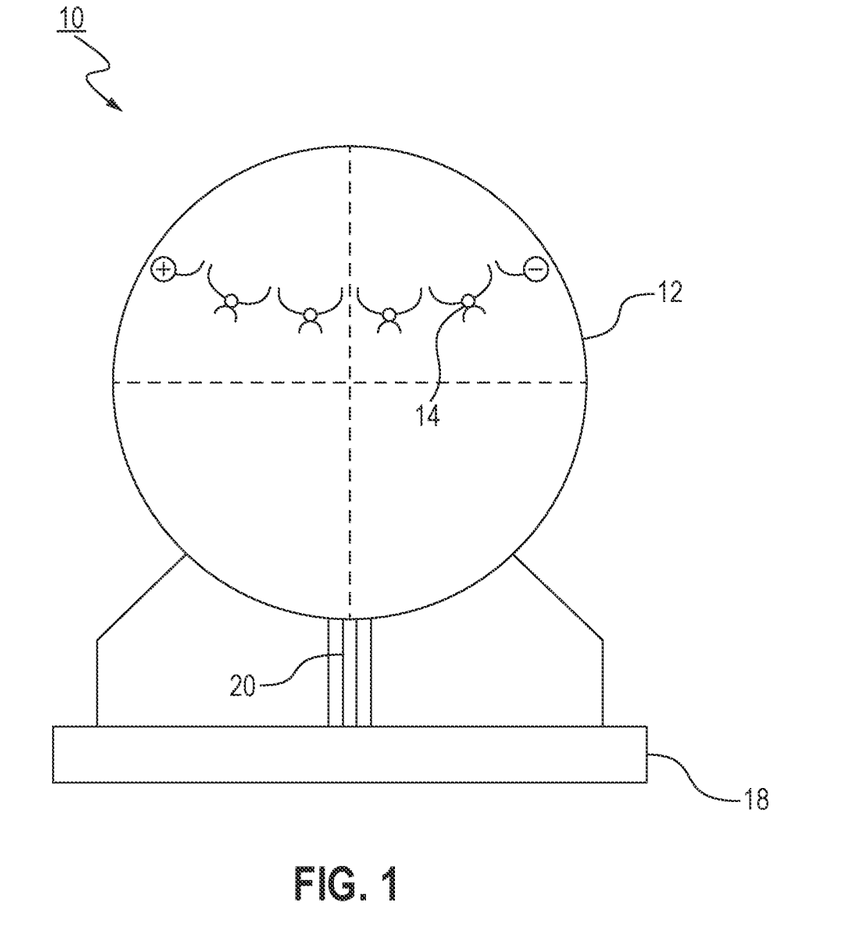
FIG. 1 is an devotional view of an embodiment of a dean energy system according to the disclosure.
Figure 2:
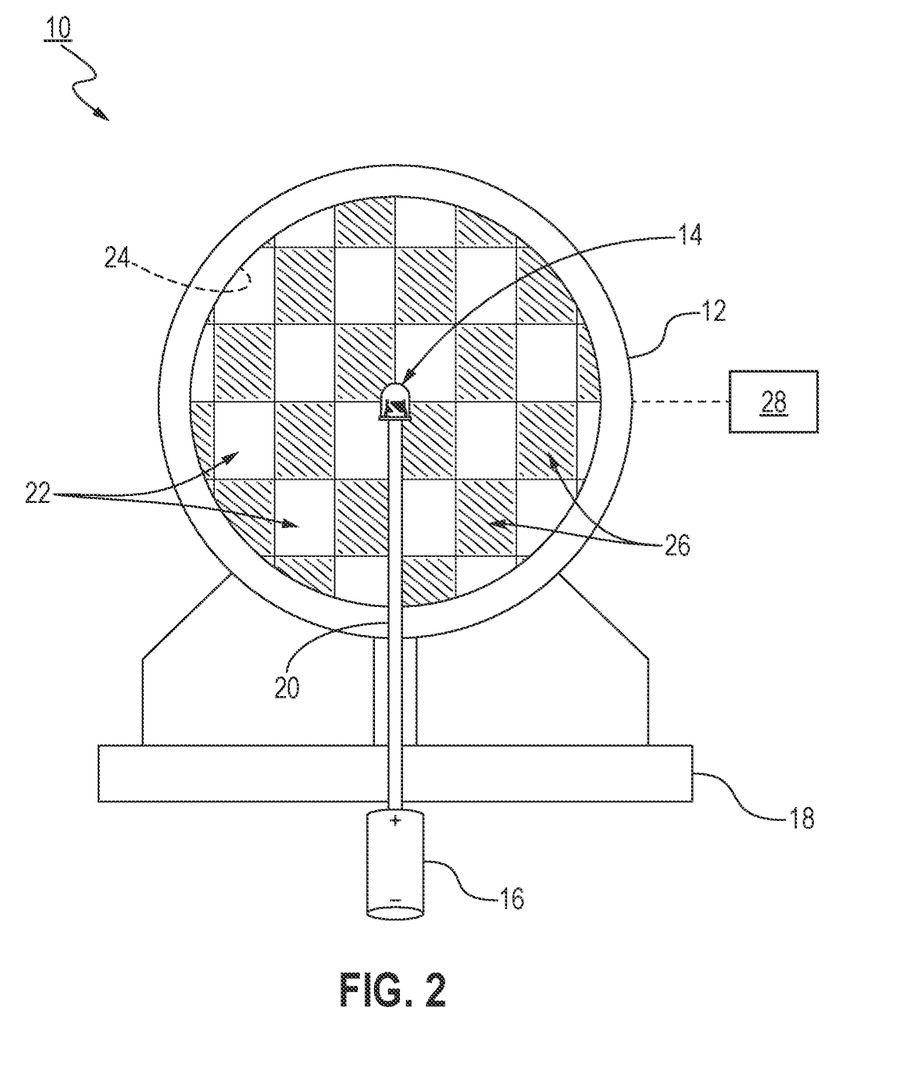
FIG. 2 is a sectional, elevational view of the clean energy system as in FIG. 1, also showing a power source.

Turning now to FIGS. 1 and 2, an embodiment of a self-contained, mirror-enabled, clean energy system according to the disclosure is designated broadly by element number 10. The system 10 is a non-variable energy system, i.e., it does not require nor is it reliant upon sunlight. Instead, the exemplary system 10 may include a frame, casing, or housing 12 within which light emitting diodes (LED) 14 are powered by a power supply 16, e.g., three (3) 1.5-volt (1.5v) batteries. FIG. 2 particularly shows the battery 16 schematically connected to the LED 14 via a base 18 and a stand 20 of the housing 12.

As further shown in FIGS. 1 and 2 the LEDs 14 may be connected in series, and each may be a 4.5v LED light in communication with a plurality of mirrors 22 arranged in a chamber 24 within the housing 12. Here, the mirrors 22 are placed at optimal positions to amplify and reflect light emitted from the LED 14 into a plurality of solar cells 26 within the chamber 24. As FIG. 1 particularly shows, the solar cells 26 are connected in series to produce a single current flow through the circuit. In simple terms, although the solar cells 26 "think" they are "seeing" several lights, it is the same light from the LED 14 being reflected from the several mirrors 22. Together, the solar cells 26 produce an output current, shown schematically as element number 28, which is connected to a junction box or generator of a home or building (not shown) to provide power thereto.

Figure 3:
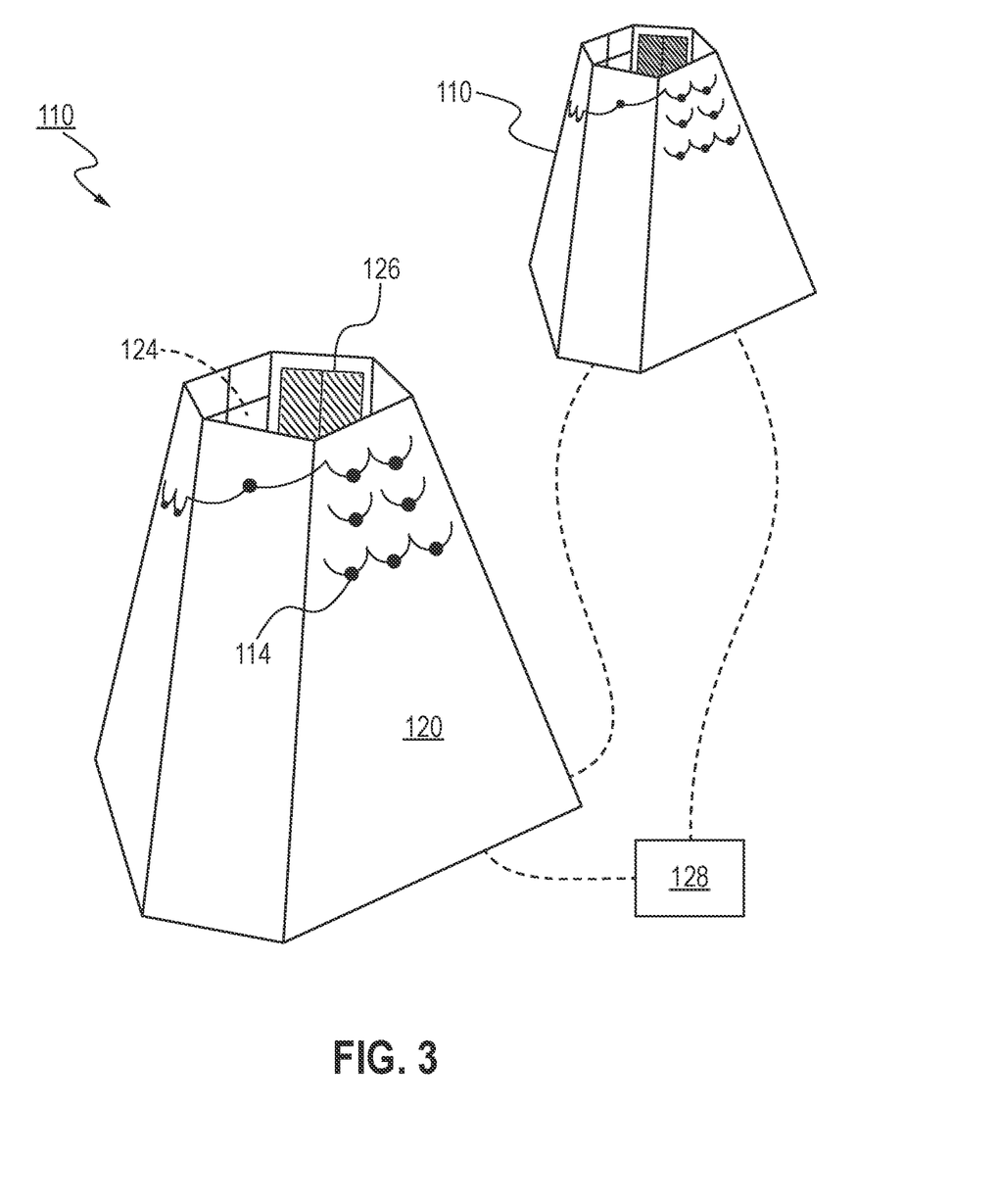
FIG. 3 is a top perspective view of another embodiment of a clean energy system according to the disclosure.

FIG. 3 shows another embodiment of a self-contained, mirror-enabled, clean energy system 110. Here, a bell-shaped, six-sided structure 120 may be provided that is approximately twelve (12) inches in height. Multiple LEDs 114 are arranged within a chamber 124 of the structure 120 such that the LEDs 114 (indicated schematically to reveal the internal arrangement) shine and reflect their light to multiple solar cells 126, which are also arranged within the chamber 124. Both the LEDs 114 and the cells 126 are connected respectively to produce current delivered to an end user, shown schematically as a junction box 128, which may deliver power to another junction box, to a generator of a home or building (not shown) to provide power thereto, et cetera. As further shown in FIG. 3, the clean energy system 110 may be connected to another dean energy system 110 to increase power output to the end user 128. Additional systems 110, including those of different sizes, shapes, and power output capabilities, may also be employed and arranged with those illustrated.

Figure 4:
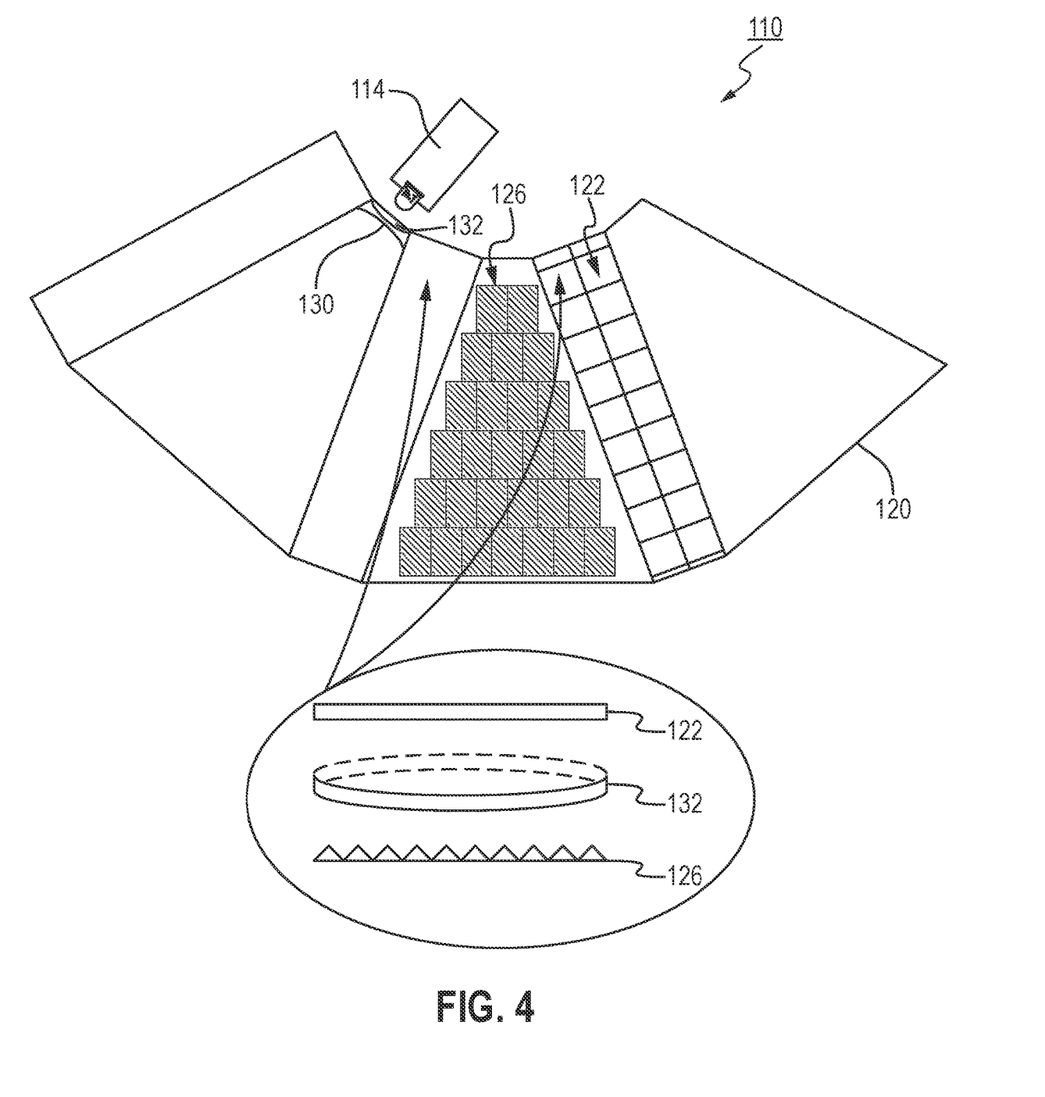
FIG. 4 shows a detailed exploded view of the embodiment as in FIG. 3, including an inset of an exemplary mirror and lens arrangement.

FIG. 4 shows the clean energy system 110 of FIG. 3 in greater detail. Here, the six-sided structure 120 is in an open state to reveal the solar cells 126 most clearly within the chamber 124. Again, the solar cells 126 receive light from the LEDs 114 after the light has been reflected from a plurality of mirrors 122 within the system 110. A magnification lens 130 may be provided to amplify the light from the LED light 114 before it arrives at the solar cells 126.

FIG. 4 also shows a magnification lens 130 and additional lenses 132 (see exploded inset view) that may be arranged to further amplify, reflect, and direct light from the LED 114 into the mirrors 122 that are attached to the angled interior sides of the chamber 120 when in a folded or closed state as shown in FIG. 3. FIG. 4 also most clearly shows the six inside walls of the chamber 120, which are lined with alternating mirrors 122 and solar cells 126. The angles of the walls are selected to reflect the light throughout the chamber 120 into the solar cells 126 at angles reaching nearly ninety degrees (90°), which was discovered to be the most efficient angle for the solar cells 126. In one experimental prototype, sixty-six (66) 1.4v solar cells 126 were tested successfully and produced over 50v, which was sufficient to power the system 110 and generate power for ten other LED lights 114 in ten similar chambers 120.

Figure 5:
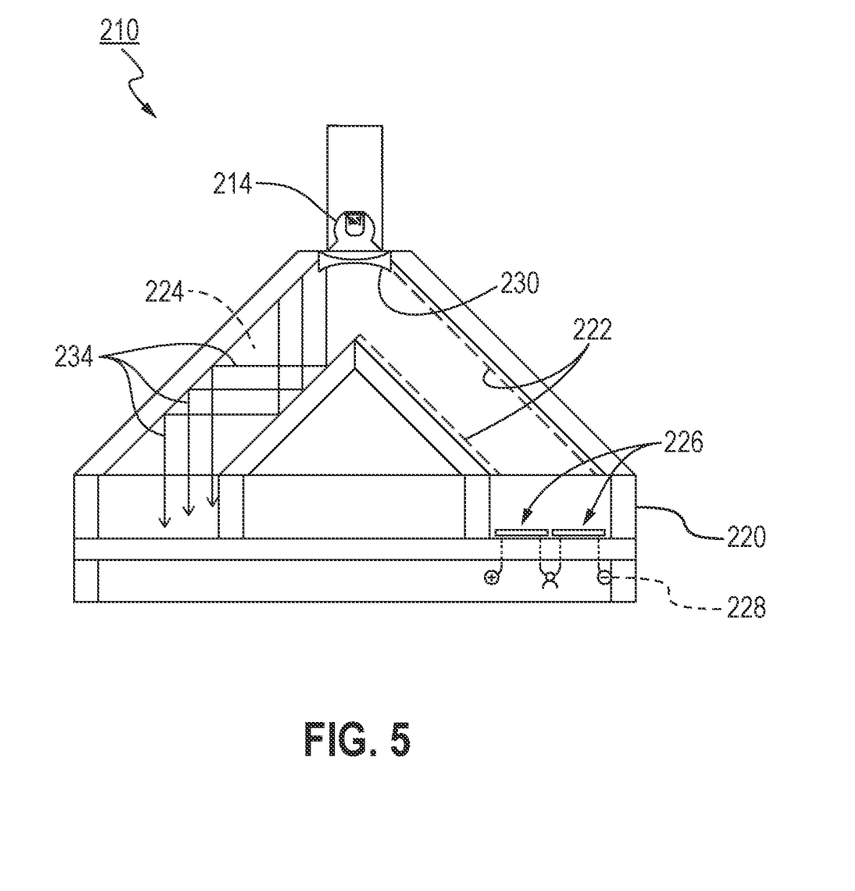
FIG. 5 is a partial sectional view of another embodiment of a clean energy system according to the disclosure.
Figure 6:
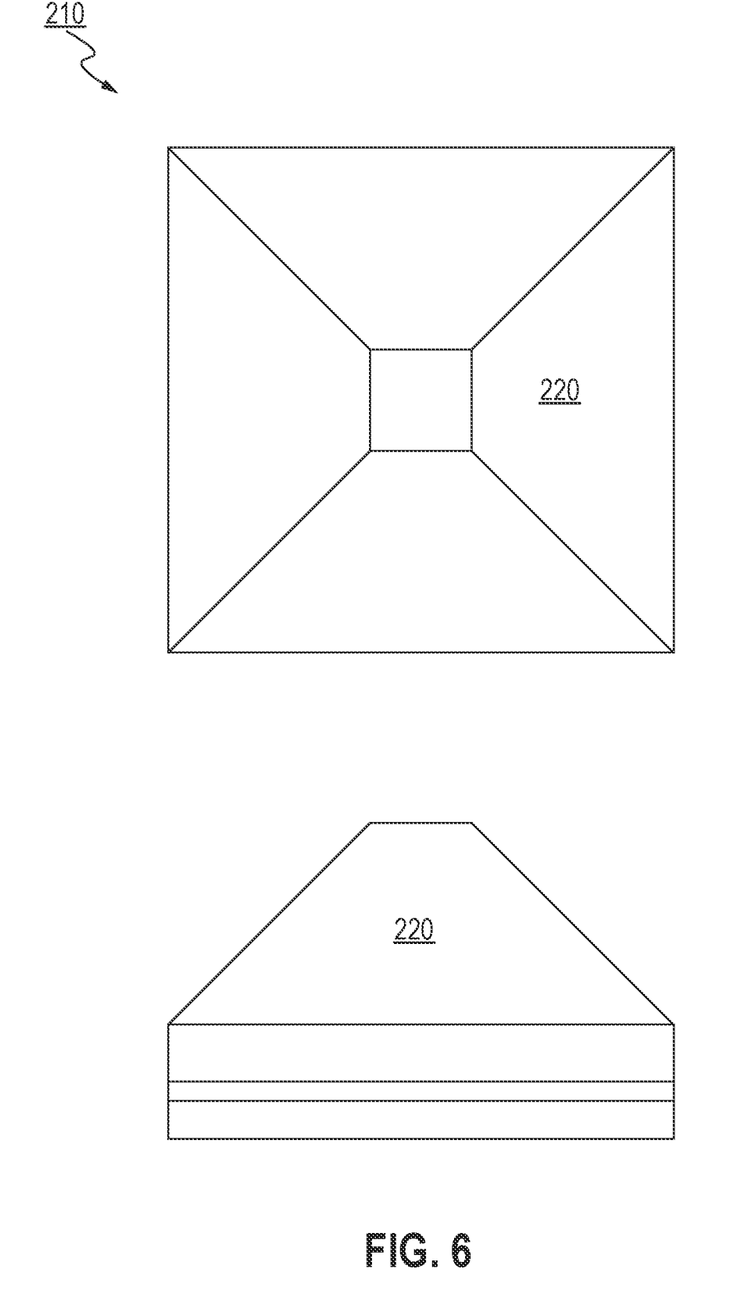
FIG. 6 shows a top plan view and an elevational view of the embodiment as in FIG. 5.

FIGS. 5 and 6 show another embodiment of a self-contained, mirror-enabled, clean energy system designated broadly by element number 210. The exemplary system 210 may include a magnification lens 230 that amplifies and directs light 234 from an LED 214 into mirror tiles 222 arranged within a chamber 224 of a system housing 220. Here, interior surfaces of the chamber 220 are lined with alternating mirrors 222 with solar cells 226 connected in series and located to receive the light 234 and generate voltage sufficient to power the system 210 and produce and deliver current to a junction box or generator of a home or building (not shown), indicated schematically as element number 228.

Figure 7:
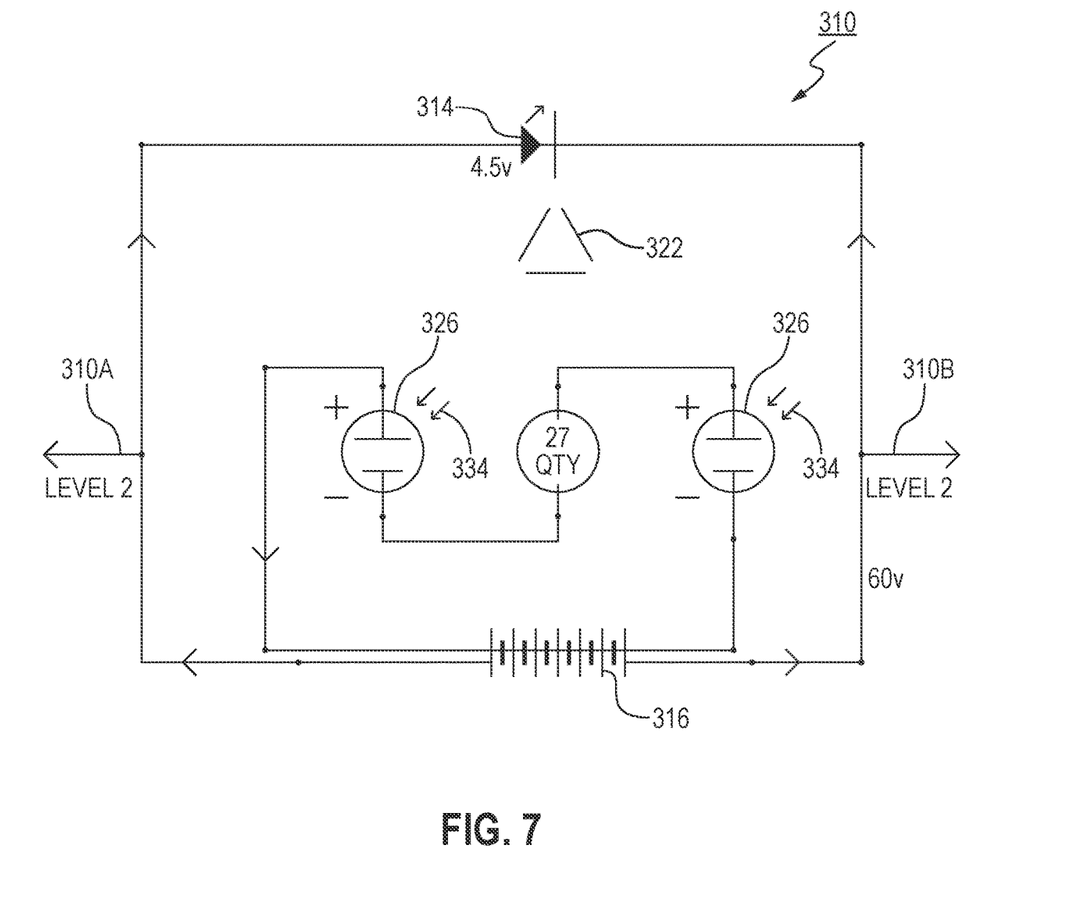
FIG. 7 shows an electrical diagrammatic of a power system that may be associated with the embodiments according to the disclosure.

As shown in FIG. 7, an electric circuit 310 according to another aspect of the disclosure is configured to include a light source such as an LED 314, a power source such as a battery 316, and a generating source such as solar cells 326. Here, light 334 from the light source 314 is reflected by mirrors 322 into the solar cells 326, which are shown connected in series in the circuit 310 to produce and deliver current to another circuit, indicated here as a Level Two systems 310A and 310B.

Figure 8:
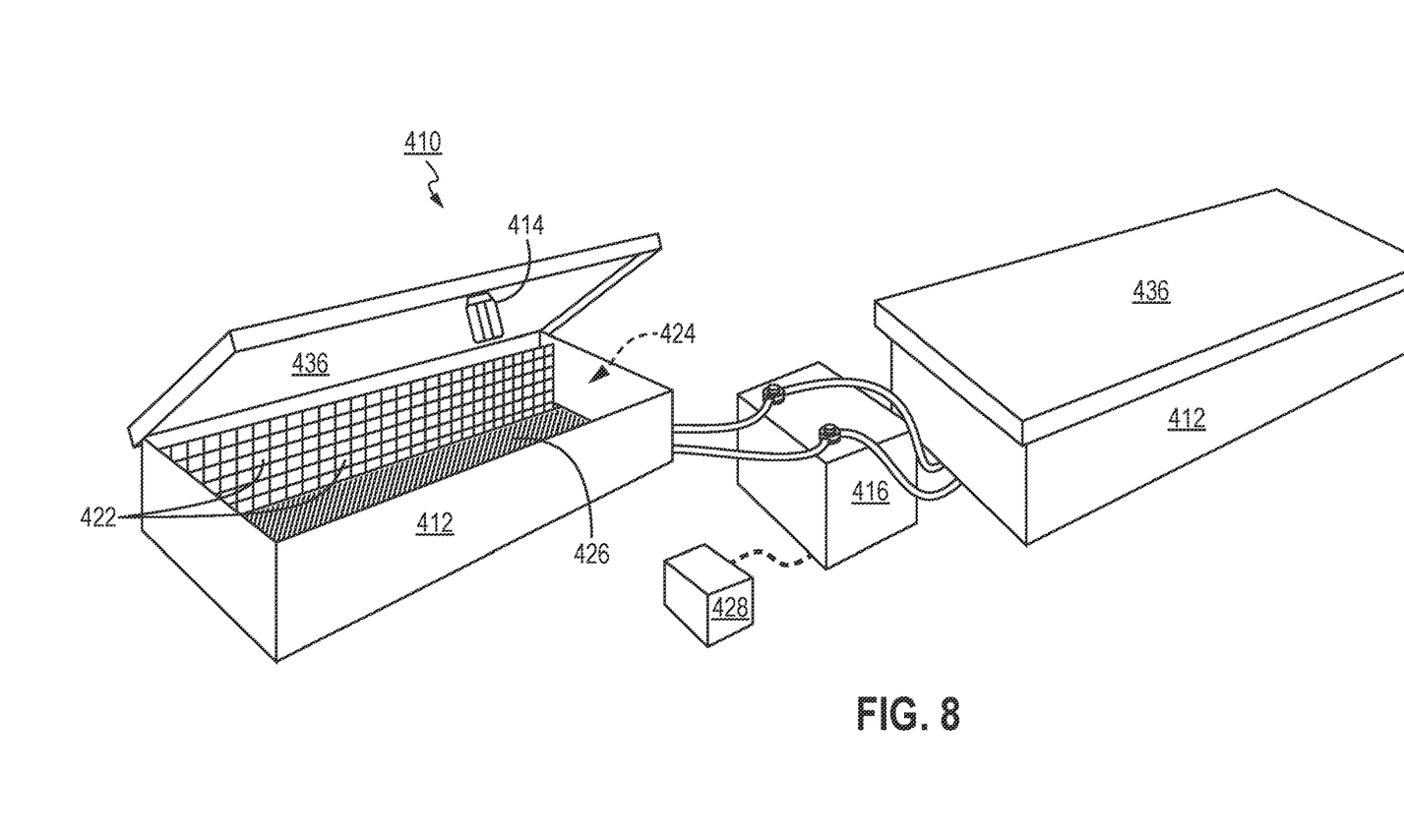
FIG. 8 shows another embodiment of a clean energy system according to the disclosure.

Turning to FIG. 8 another embodiment of a self-contained, mirror-enabled, clean energy system is designated broadly by element number 410. Here, multiple structures 412, essentially rectangular in shape, can be arranged together to produce a combined power output to a home, office, or other end user indicated schematically as a consumption structure 428. In this example, a lid or cover 436 is in an open position as shown in the left most structure 412 to reveal various components. Based on a size of a solar panel 426 arranged in each chamber 424 in this exemplary embodiment, each housing 412 measures sixteen inches by nine inches by forty-four inches (16"×9"×44"). However, the housings 412 are not limited to this example and may be longer, shorter, wider, et cetera as needed. Still further, the housings 412 may be square in shape or other shapes to accommodate various end use needs.

FIG. 8 further shows an LED 414 installed in the housing 412. In this example, the LED 414 is attached to the lid 436 and powered by a power supply such as a battery 416. Here, the LED 414 is in communication with a plurality of mirrors 422 arranged in the chamber 424 of the housing 412. The mirrors 422 are placed at optimal positions to amplify and reflect light emitted from the LED 414 into the solar cell 426. As introduced above, the solar cell 426 produces current from the light reflected and amplified by the mirrors 422, and the power is delivered to the end user structure 428.

Figure 9:
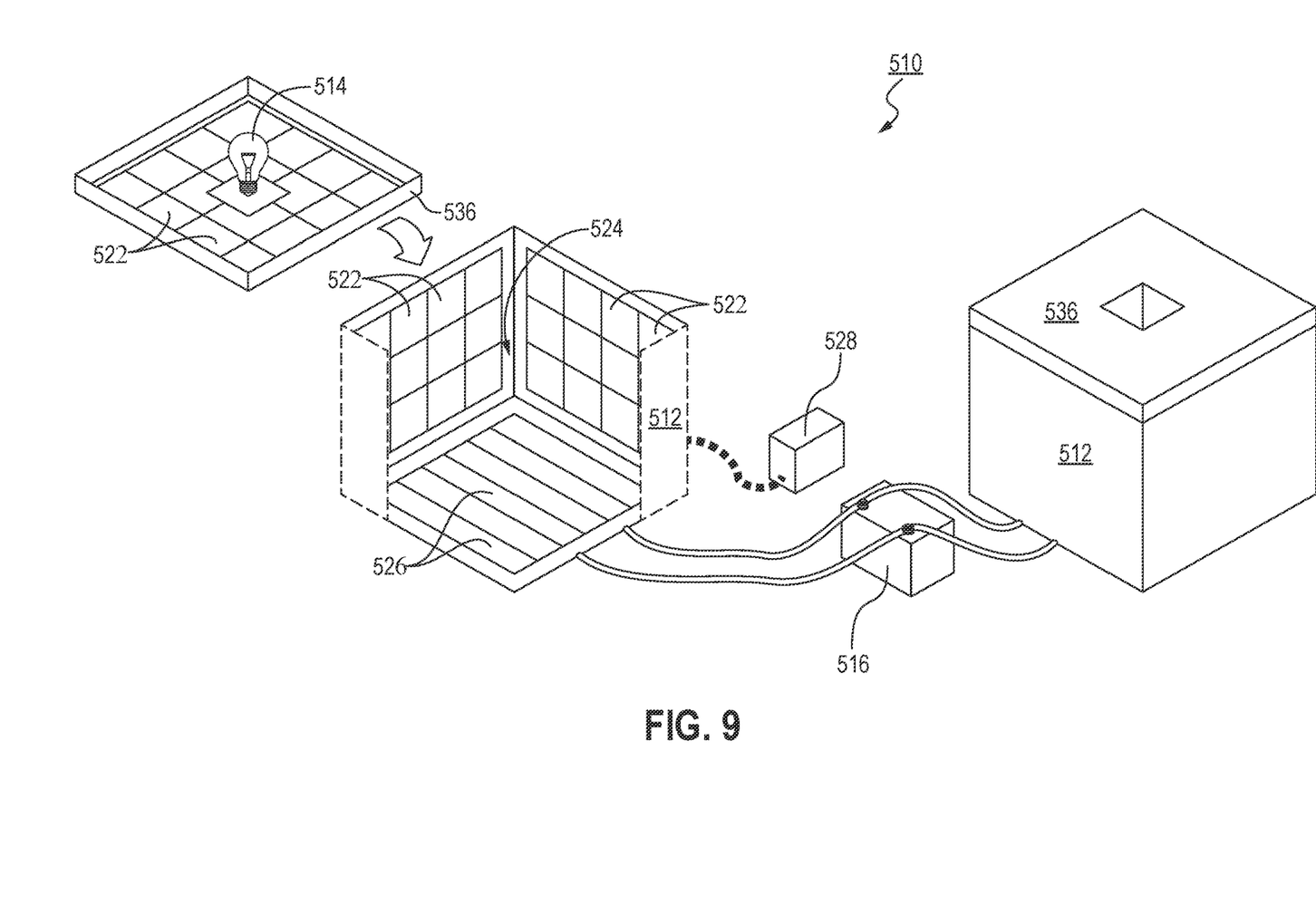
FIG. 9 shows a further embodiment of a clean energy system according to the disclosure in which one power system is shown in partial, exploded view for clarity.

FIG. 9 is another embodiment of a self-contained, mirror-enabled, clean energy system which is designated broadly by element number 510. Here, multiple structures 512, essentially square or rectangular in shape, can be arranged together to produce a combined power output to a home, office, or other end user indicated schematically as a consumption structure 528. The exemplary housings 512 are not limited to this example and may be longer, shorter, wider, et cetera as needed. Still further, the housings 512 may be other shapes to accommodate mirror and panel sizes and other end user needs.

FIG. 9 further shows that one of the lids or covers 536 is in an open position relative to the left most structure 512 to reveal various components, i.e., light 514 and mirrors 522 inside of the lid 536 with additional mirrors 522 and solar panels 526 arranged in space 524. The light 514 may be inserted through or attached to the lid 536 and, as shown schematically, is powered by a power supply or battery 516, such as via electrically conductive contact surfaces at edges of the housing 512 and the lid 536. The light 514 is in further communication with a plurality of mirrors 522 arranged around the lid 536 and in the chamber 524. Here, the mirrors 522 are placed at optimal positions to amplify and reflect light emitted from the light 514 into the solar cells 526, which produce current from the reflected light as amplified by the mirrors 522, and the power is delivered to the end user 528.

Figure 10:
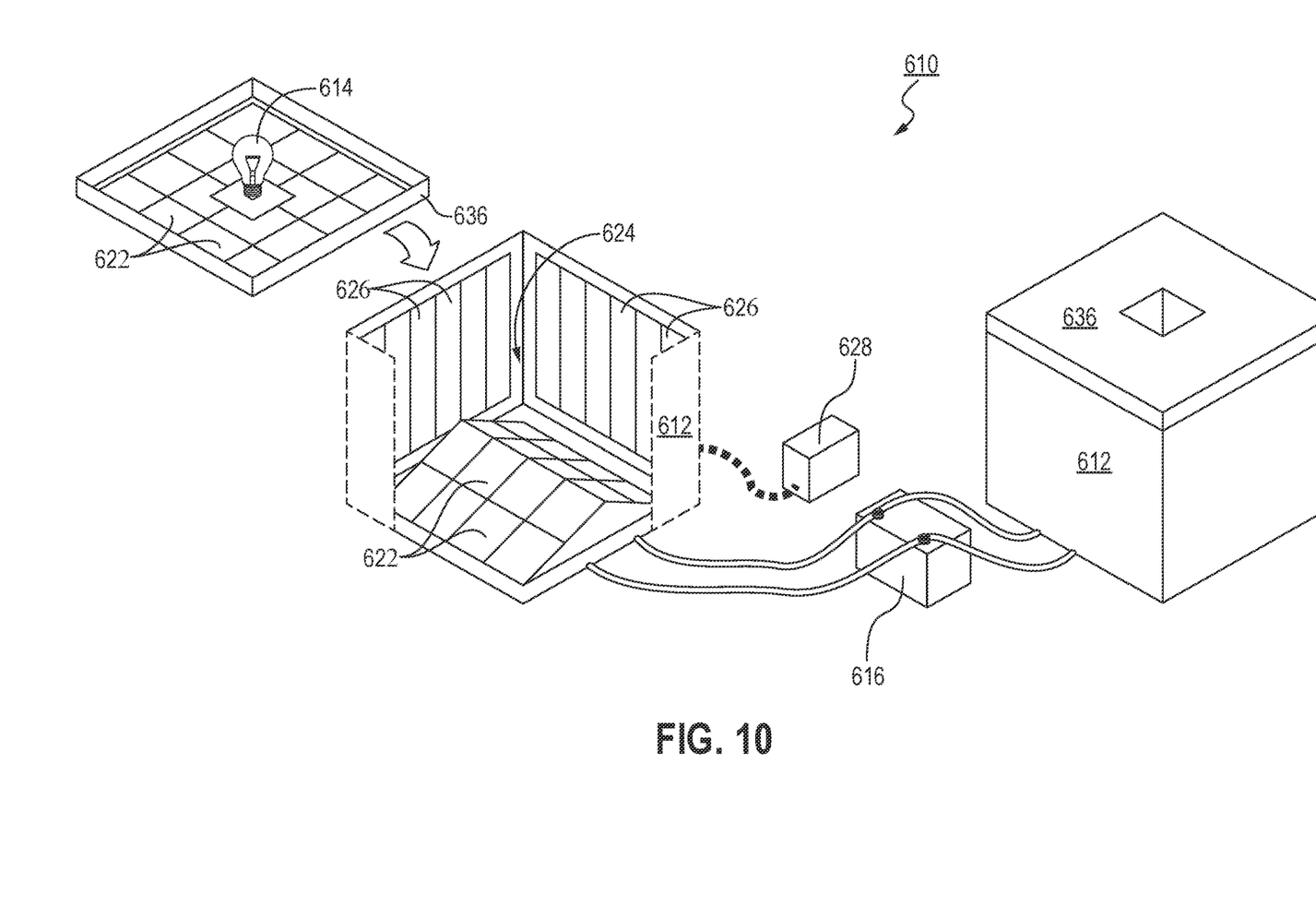
FIG. 10 shows yet another embodiment of a clean energy system according to the disclosure in which one power system is shown in partial, exploded view for clarity.

FIG. 10 is an additional embodiment of a self-contained, mirror-enabled, clean energy system, which is designated broadly by element number 610. Here again, multiple structures 612, essentially square or rectangular in shape, may be arranged together to produce a combined power output to a home, office, or other end user indicated schematically as a consumption structure 628. The exemplary housings 612 are not limited to this example and may be longer, shorter, wider, et cetera as needed. Still further, the housings 612 may be other shapes and combination of shapes to accommodate mirror and panel sizes and other end user needs.

FIG. 10 shows that one of the lids or covers 636 is in an open position relative to the left most structure 612 to reveal various components, i.e., light 614 and mirrors 622 inside of the lid 636 with additional mirrors 622 and solar panels 626 arranged in space 624. In this example, some mirrors 622 are arranged in a ramp or pyramid shape to concentrate or particularly direct light reflection to the solar panels 626. As shown, the light 614 may be inserted through or attached to the lid 636 and, as shown schematically, the light 614 is powered by a power supply or battery 616, such as via electrically conductive contact surfaces at edges of the housing 612 and the lid 636. The light 614 is in further communication with the plurality of mirrors 622 arranged around the lid 636 and in the chamber 624. Here, the mirrors 622 are placed at optimal positions to amplify and reflect light emitted from the light 614 into the solar cells 626, which produce current from the reflected light as amplified by the mirrors 622, and the power is delivered to the end user 628.

An initial prototype of the foregoing concept produced over 50v ("Level One"). The Level One system was sufficient to power the system itself as well as to generate surplus power for LED lights in ten other chambers ("Level Two"). Each of the Level Two chambers can power LEDs in ten more chambers. Exemplary test data is described below. Thus, the inventor has discovered and concluded the following:

| Level One | One 4.5 v LED | Produces 50 vDC |
|---|---|---|
| Level Two | Ten 4.5 v LEDs | Produce 500 vDC |
| Level Three | One hundred 4.5 v LEDs | Produce 5000 vDC |

Although DC to AC conversion will cause a loss of approximately half of generated power, there is ample voltage to charge a battery system before the DC/AC conversion. Level Three will still provide approximately 2,500vAC, which is more power than the average American house uses at peak times each day.

Moreover, because the embodiments described herein are self-contained, they do not require connection to a power grid. This eliminates risk of power outages due to storm-induced downed power lines, damaged transformers, and the like, or due to heavy consumption resulting in "gray-outs." Still further, the embodiments of the disclosure reduce any carbon footprint to virtually zero. And since there are no moving parts that deteriorate, only the LEDs need be replaced approximately every seven years or so, and possibly batteries every few years if they lose their ability to recharge. Thus, the inventor estimates that the embodiments will reduce energy costs in the average American home by approximately twenty-five thousand dollars over a 20-year period.

Exemplary Test Data.

A red flashlight was utilized as a light source using three 1.5-volt batteries. The flashlight was employed in two settings: one with five LEDs illuminated and one with fifteen LEDs illuminated. "Solar System" as used herein is a term employed by the inventor as a shorthand reference to various embodiments of the inventions.

Experiment 1

Employing a voltage meter and using five cells connected in series resulted in 2.2 volts output. A second test utilized fifteen LED lights, which resulted in 2.75 volts output.

Experiment 2

Five cells were connected in series in sunlight resulting in 5.6 volts. The next planned experiment will use additional LEDs with reduced voltage.

Experiment 3

Mirror tests were conducted utilizing a red flashlight with five lights, which resulted in 2.8 volts, and 15 lights resulted in 3.16 volts. Light was directed through magnification lenses but no change in voltage output was observed.

Experiment 4

One side of the system was lined with a 12-inch foam ball using twenty-one ⅝ inch mirrors and 35 solar cells; thus:

2.2÷5=0.44×21=9.24

0.44×35=15.4

So, 15.4×2=30.8−4.5=26.3 volts in solar cell ball

An observation from this experiment is that to achieve greater efficiency at least 49.5v is needed; i.e., 45=10×4.5v to power 10 more lights comparable to the red flashlight plus 4.5v to power the first red flashlight. Achieving these numbers will enable the system to run on its own power.

Experiment 5

The ball was completed with wired light: 3v light created 6v of power proving the system concept. Different variables were tested including more mirrors, which produced more light.

Experiment 6

Observation: the solar system device appears similar to the interior of the Fat Man atomic bomb, the design of which was known to have transitioned from a rail bomb to an implosion bomb design. Accordingly, in this experiment, the light was moved from center to a side of a half sphere and a flat mirror was placed over the open end. Each side of the solar system ball was tested against a flat mirror. Each side has 43 solar cells but fewer mirrors, which resulted in 5.1v standing alone. A side with 32 solar cells and more mirrors registered 6.5v. This is a promising power output, but the shape must be modified. More lights will be used in the ball and if the results are less than optimal, the plan is to break down parts of the ball and use those parts in a tube-shaped device, perhaps with mirrors on each end.

Experiment 7

Hypothesis: if sufficient power can be produced from one Solar System, it may be used to power another Solar System. This table lists expected power:

| LEVELS | Number of Solar Systems | WATTS |
|---|---|---|
| 1 | 1 | 10/10 |
| 2 | 1 | 20 |
| 3 | 2 | 40 |
| 4 | 4 | 80 |
| 5 | 8 | 160 |
| ... | ... | ... |
| 12 | 1024 | 20,480 |

This is sufficient power to run an average house but may be too large fit in the house.

Experiment 8

Hypothesis: a three-sided solar system will increase mirror reflection with mirrored panels between solar cell panels. Next, a four-sided 45° angled pyramid design will be created and tested.

| LEVELS | Solar Systems | WATTS |
|---|---|---|
| 1 | 1 | 9/18 |
| 2 | 2 | 54 |
| 3 | 6 | 162 |
| ... | ... | ... |
| 7 | 486 | 13,122 |

Experiment 9

A three-sided cone with a 9v flashlight 42 cells will be tested. Observation and hypothesis: different shaped mirrors might work differently. Several different mirrors were made and tested; some with mirrors extended away from the device.

| MIRROR SHAPE | VOLTAGE TESTED |
| --- | --- |
| 1. concave | 19.6-volts |
| 2. convex | 24.5-volts |
| 3. flat | 22.0-volts |
| 4. pyramid | 17.6-volts |
| 5. small cones | Not tested |
| 6. concave with extension | 20.5-volts |

Experiment 10

A "half ball" from the first solar system is tested with the following results:

| MIRROR SHAPE | VOLTAGE TESTED IN NEW DESIGN |
| --- | --- |
| 1. concave | 18.8-volts |
| 2. convex | 20.8-volts |
| 3. flat | 22.0-volts |
| 4. pyramid | 19.2-volts |

Experiment 11

A new design with a convex mirror and 48 solar cells was designed and tested resulting in 26.8v.

Experiment 12

Prepared and tested a new "rail bomb" design using seventy solar cells with flat mirrors, which registered 40-watts.

Experiment 13

Using a new, brighter flashlight, which operates on three 1.5V batteries and another flashlight that uses six 1.5v batteries, which resulted in:

| First Light | flat mirror | 2nd design Solar System | 37-volts |
| Second Light | flat mirror | 2nd design Solar System | 41-volts |

The Second Design Solar System under regular shop light resulted in 59.2-volts and using standard room light resulted in 48-volts. Also tested a new Solar System design with purple film over the light source to allow UV only, which resulted in 14-volts.

Experiment 14

Tested magnification over light but voltage levels dropped.

Experiment 15

A wider base was added to accommodate additional solar cells, which resulted in 23.2-volts.

Experiment 16

Three lines of mirrors were added between solar cell panels to increase incident light angle into solar cells. Voltage output increased slightly to 24.8-volts Experiment 17

Hypothesis: will increase width of the solar panel sides to accommodate additional solar cells, which will also improve the angle for light to reflect into the solar cells.

Experiment 18

Prepared new design using different angles with different mirror shapes, which resulted in the following outputs:

| Concave | 46-volts |
| Convex | 39-volts |
| Flat | 48-volts |
| Pyramid | 45-volts |

Experiment 19

Prepared mirror surface using several small cone shaped mirrors, which resulted in 37.0v. When a flat mirror was added to the underside of the mirror cones, the voltage dropped to 31.5-volts.

By way of example and not of limitation, exemplary embodiments include but are not limited to:

Embodiment 1

A clean energy system, comprising:
a housing having a chamber formed therein;
a light source disposed proximate the housing, light rays from the light source being directed into the chamber;
a plurality of mirrors disposed within the chamber, the light rays being incident to the mirrors; and
a plurality of solar panels disposed within lines of sight of the mirrors, the incident light rays being reflected by the mirrors into the solar panels to generate electrical power.

Embodiment 2

The clean energy system as in Embodiment 1, wherein the housing is a six-sided structure.

Embodiment 3

The clean energy system as in Embodiments 1 or 2, wherein the housing is shaped substantially conically.

Embodiment 4

The clean energy system as in any of the foregoing embodiments, wherein the light source is a it emitting diode.

Embodiment 5

The clean energy system as in any of the foregoing embodiments, wherein the solar panels are connected in series.

Embodiment 6

The clean energy system as in any of the foregoing embodiments, herein the plurality of mirrors and the plurality of solar panels are arranged alternately within the chamber.

Embodiment 7

The clean energy system as in any of the foregoing embodiments, wherein at least some of the mirrors within the chamber are arranged in a pyramid shape.

Embodiment 8

The clean energy system as in any of the foregoing embodiments, further comprising a magnification lens configured to amplify the light rays from the light source into the plurality of mirrors.

Embodiment 9

A method of producing clean energy, comprising:
providing a housing having a chamber formed therein;
providing a light source disposed proximate the housing;
illuminating the light source to produce light rays and directing the light rays into the chamber;
placing a plurality of mirrors within the chamber such that the light rays are incident to the plurality of mirrors;
placing a plurality of solar panels within lines of sight of the mirrors;
reflecting the incident light rays from the mirrors into the solar panels; and
generating electrical power from the solar panels.

Embodiment 10

The method of producing clean energy as in Embodiment 9, further comprising directing the electrical power from the solar panels into at least one other chamber to generate additional electrical power in the other chamber.

Embodiment 11

The method of producing, clean energy as in claim 9, further comprising providing a second housing having a second chamber formed therein; providing a second light source disposed proximate the second housing; illuminating the second light source to produce a second set of light rays and directing the second set of light rays into the second chamber; placing a second plurality of mirrors within the second chamber such that the second set of light rays are incident to the second plurality of mirrors; placing a second plurality of solar panels within lines of sight of the second set of mirrors; reflecting the incident light rays from the second set of mirrors into the second plurality of solar panels; generating additional electrical power from the second plurality of solar panels; and combining the electrical power from the solar panels with the additional electrical power from the second plurality of solar panels.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

That which is claimed is:

1. A clean energy system, comprising:
a housing having a plurality of interconnected trapezoidal panels connected to a bottom panel and a top panel, wherein the trapezoidal panels, bottom panel and top panel form a closed chamber;
a light source, disposed within the closed chamber at a chamber apex, energized by a power supply, light rays from the light source being directed towards the bottom panel of the closed chamber;
a reflector having a pyramid shape defining a plurality of faces, wherein said reflector is carried within the closed chamber by the bottom panel and a reflector apex is aligned with the chamber apex along an axis;
a plurality of mirrors covering the plurality of faces and the plurality of trapezoidal panels, each mirror facing into the closed chamber, the light rays being incident to the mirrors; and
a plurality of solar panels carried by the bottom panel facing into the closed chamber, the incident light rays being reflected by the mirrors into the solar panels to generate electrical power.

2. The clean energy system as in claim 1, wherein the light source is a light emitting diode.

3. The clean energy system as in claim 1, wherein the solar panels are connected in series.

4. The clean energy system as in claim 1, further comprising a magnification lens configured to amplify and direct the light rays from the light source into the plurality of mirrors.

5. A method of producing clean energy, comprising:
providing a housing having a chamber formed therein, said chamber closed to exclude ambient light and to contain internal light;
providing a light source carried by the housing directed into the chamber;
providing a power supply to energize the light source;
illuminating the light source to produce light rays and directing the light rays into the chamber;
placing a plurality of mirrors within the chamber such that the light rays are incident to the plurality of mirrors;
placing a solar panel within the chamber and within lines of sight of the mirrors;
reflecting the incident light rays from the mirrors into the solar panel; and
generating electrical power from the solar panel.

6. The method of producing clean energy as in claim 5, further comprising directing the electrical power from the solar panel into a second chamber to illuminate a second light source to generate additional electrical power in the second chamber.

7. The method of producing clean energy as in claim 5, further comprising:
providing a second housing having a second chamber formed therein, said second chamber closed to exclude ambient light and to contain internal light;
providing a second light source carried by the second housing;
powering the second light source with electricity generated by the solar panel;
illuminating the second light source to produce a second set of light rays and directing the second set of light rays into the second chamber;

placing a second plurality of mirrors within the second chamber such that the second set of light rays are incident to the second plurality of mirrors;

placing a second solar panel within the chamber and within lines of sight of the second set of mirrors;

reflecting the incident light rays from the second set of mirrors into the second solar panel;

generating additional electrical power from the second solar panel; and combining the electrical power from the solar panel with the additional electrical power from the second solar panel.

8. A clean energy system, comprising:

a housing having a plurality of interconnected wall panels connected to a bottom panel, wherein the wall panels and bottom panel form a closed chamber capable of excluding ambient light and containing internal light;

a light source disposed within the closed chamber at a chamber apex, energized by a power supply, light rays from the light source being contained within the closed chamber and directed towards the bottom panel of the closed chamber a reflector, pyramid in shape with a plurality of faces, disposed within the closed chamber and carried by the bottom panel, arranged such that a reflector apex is in line of sight with the light source;

a plurality of mirrors covering the plurality of faces and the plurality of wall panels, each mirror facing into the chamber, the light rays being incident to the mirrors; and a solar panel carried by the bottom panel facing into the closed chamber, the incident light rays being reflected by the mirrors into the solar panel to generate electrical power.

9. The clean energy system of claim 8 wherein each face of the reflector corresponds with one of the wall panels of the housing.

10. The clean energy system of claim 8 wherein the chamber apex, light source, and reflector apex are on a center axis of the housing.

11. The clean energy system as in claim 8, wherein the light source is a light emitting diode.

* * * * *